United States Patent
Rätz

(10) Patent No.: US 10,171,071 B2
(45) Date of Patent: Jan. 1, 2019

(54) DEVICE AND METHOD FOR PRODUCING A DYNAMIC REFERENCE SIGNAL FOR A DRIVER CIRCUIT FOR A SEMICONDUCTOR POWER SWITCH

(71) Applicant: POWER INTEGRATIONS, INC., San Jose, CA (US)

(72) Inventor: Markus Rätz, Leuzigen (CH)

(73) Assignee: Power Integrations, Inc., San Jose, CA (US)

( * ) Notice: Subject to any disclaimer, the term of this patent is extended or adjusted under 35 U.S.C. 154(b) by 0 days.

(21) Appl. No.: 15/313,488

(22) PCT Filed: Jun. 11, 2015

(86) PCT No.: PCT/EP2015/063060
§ 371 (c)(1),
(2) Date: Nov. 22, 2016

(87) PCT Pub. No.: WO2015/189332
PCT Pub. Date: Dec. 17, 2015

(65) Prior Publication Data
US 2017/0187367 A1    Jun. 29, 2017

(30) Foreign Application Priority Data
Jun. 11, 2014   (EP) .................................... 14172012

(51) Int. Cl.
*H03K 17/082*   (2006.01)
*H03K 5/08*     (2006.01)
*H03K 17/16*    (2006.01)

(52) U.S. Cl.
CPC .......... *H03K 17/0828* (2013.01); *H03K 5/08* (2013.01); *H03K 17/082* (2013.01); *H03K 17/168* (2013.01); *H03K 17/163* (2013.01)

(58) Field of Classification Search
CPC .... H03K 17/00; H03K 17/0828; H03K 19/00; H03K 19/00315; H03K 19/00361;
(Continued)

(56) References Cited
U.S. PATENT DOCUMENTS
5,453,669 A * 9/1995 Nishibe ............... H02H 7/0851
                                                    318/432

* cited by examiner

*Primary Examiner* — Lincoln Donovan
*Assistant Examiner* — David Mattison
(74) *Attorney, Agent, or Firm* — Chirstensen O'Connor; Johnson Kindness PLLC

(57) ABSTRACT

A device (442) for producing a dynamic reference signal ($U_{REF}$) for a control circuit for a power semiconductor switch comprises a reference signal generator (442) for providing a dynamic reference signal ($U_{REF}$), which has a stationary signal level after elapse of a predefined time following a switching process of the power semiconductor switch, a passive charging circuit (450) which is configured to increase a signal level of the dynamic reference signal in reaction to a switching of a control signal of the power semiconductor switch from an OFF state to ON state for at least one part of the predefined time above the stationary signal level, in order to produce the dynamic reference signal and an output (A) for tapping the dynamic reference signal ($U_{REF}$).

15 Claims, 10 Drawing Sheets

(58) Field of Classification Search
CPC ...... H03K 19/00384; H03K 5/00; H03K 5/08; H04L 25/00; H04L 25/0272; H04L 25/028
USPC .......................................................... 327/108
See application file for complete search history.

DEVICE AND METHOD FOR PRODUCING A DYNAMIC REFERENCE SIGNAL FOR A DRIVER CIRCUIT FOR A SEMICONDUCTOR POWER SWITCH

REFERENCE TO RELATED APPLICATIONS

This application is the U.S. National Stage entry under 35 U.S.C. § 371 of international application PCT/EP2015/063060, filed 11 Jun. 2015, which in turn claims priority to European patent application EP 14172012.8, filed 11 Jun. 2014.

TECHNICAL FIELD

The present invention relates to a device and a method for producing a variable reference signal for a driver circuit for a semiconductor power switch. Such devices are used for example for detecting a short-circuit or overcurrent state in an IGBT ("Insulated Gate Bipolar Transistor").

BACKGROUND

In some power semiconductor switches, high voltages can be applied and high currents can be carried. Short circuits or excessively increased currents can therefore rapidly lead to the thermal destruction of the power semiconductor switches. Therefore, power semiconductor switches can have protective circuits for detecting a short-circuit or overcurrent state. One possibility for detecting these states is the indirect monitoring of the current through the power semiconductor switch on the basis of a voltage dropped across the power semiconductor switch. After the power semiconductor switch has been switched on, said voltage should fall quickly from a relatively high level in the switched-off state (the "switched-off state" or "OFF state" is a state of the power semiconductor switch in which the latter is "open" and carries no current) to a relatively low level in the switched-on state (the "switched-on state" or "ON state" is a state of the power semiconductor switch in which the latter is "closed" and can carry current). Correspondingly, a control signal of a power semiconductor switch (for example a gate-emitter driver signal) has an ON state, in which it keeps the power semiconductor switch closed, and an OFF state, in which it keeps the power semiconductor switch open.

The solid curve 678 at the bottom left in FIG. 6 shows an exemplary profile of a collector-emitter voltage of an IGBT (an IGBT is an exemplary power semiconductor switch) during the switchover process from a switched-off state into a switched-on state (the profile of an associated exemplary control signal 630 is illustrated at the top left). As illustrated, the collector-emitter voltage falls sharply to a very low value (close to 0 volts). An exemplary short-circuit behavior of an IGBT is illustrated at the bottom right in FIG. 6 (solid curve 678). In contrast to normal operation, the collector-emitter voltage does not fall to the very low value; simultaneously, however, high currents can flow in the IGBT (for example between three times and ten times the nominal current of the IGBT). In other short-circuit cases, the collector-emitter voltage indeed firstly falls to the value in normal operation, but then rises again. This results in a high thermal loading of the power semiconductor switch, which can incur damage after a relatively short time. In this regard, for example, some IGBTs in the switched-on state withstand a short circuit for approximately 10 µs without incurring damage. Therefore, the protective circuits for detecting a short-circuit or overcurrent state in this time range can ensure that the power semiconductor switch is switched off. Similar characteristics can also be found in other power semiconductor switches besides IGBTs. An overcurrent state, like a short-circuit state, can be manifested by an increased collector-emitter voltage. However, in the overcurrent case, the collector-emitter voltage can be closer to a collector-emitter voltage in the normal case in comparison with the short-circuit case.

The outlined differences in the profile of the collector-emitter voltage between normal operation and the short-circuit and/or overcurrent case can be utilized in protective circuits for detecting a short-circuit or overcurrent state, in order to detect a short-circuit or overcurrent state. It is thus possible to define a threshold value for the collector-emitter voltage, which threshold value is used to detect the presence of a short-circuit or overcurrent state. By way of example, if the collector-emitter voltage rises above the threshold value (see FIG. 6, bottom right), a short-circuit or overcurrent state can be detected.

SUMMARY OF THE INVENTION

A first device for producing a dynamic reference signal for a control circuit for a power semiconductor switch in accordance with one embodiment of the invention comprises a reference signal generator for providing a dynamic reference signal having a steady-state signal level after a predetermined time has elapsed after a switchover process of the power semiconductor switch, a passive charging circuit, which is configured to increase a signal level of the dynamic reference signal in reaction to a switchover of a control signal of the power semiconductor switch from an OFF state into an ON state for at least one part of the predetermined time above the steady-state signal level, in order to produce the dynamic reference signal, and an output for tapping off the dynamic reference signal.

Such a device makes it possible to detect a short-circuit and/or overcurrent state in a power semiconductor switch reliably and also rapidly enough. In particular, the probability of the erroneous detection of a short-circuit and/or overcurrent state can be reduced in comparison with devices having a steady-state reference signal. This is achieved by the momentary increase in the level of the reference signal for at least one part of a predetermined time in reaction to a switchover of a control signal of the power semiconductor switch from an OFF state into an ON state. At the same time the device of the invention can bring about the increase in the level of the dynamic reference signal without active components. The device can thus be more cost-effective and more robust than comparable devices having active components. In some examples, the device can be configured reliably and with a negligibly small temperature drift, with comparatively little outlay.

An exemplary profile of a dynamic reference signal is shown at the bottom left in FIG. 6 (dashed line 648). The level of the dynamic reference signal is increased abruptly in reaction to a switchover of a control signal of the power semiconductor switch from an OFF state into an ON state and thereupon falls continuously until the steady-state level is reached again. This increased reference voltage following a switchover process from an OFF state into an ON state can be used in a protective circuit. The protective circuit does not trigger since a signal ($U_{C'E}$) representing the collector-emitter voltage always remains below the reference signal.

In a second device in accordance with the first device, the dynamic reference signal is a dynamic reference voltage.

In a third device in accordance with the first or second device, the power semiconductor switch is an IGBT.

In a fourth device in accordance with any of the preceding devices, the passive charging circuit comprises an RC element.

In a fifth device in accordance with the fourth device, the passive charging circuit is configured such that the control signal of the power semiconductor switch can be coupled to a first terminal of a capacitance of the RC element and a second terminal of the capacitance of the RC element is coupled directly or indirectly to the output for tapping off the dynamic reference signal.

In a sixth device in accordance with any of the preceding devices, the passive charging circuit is configured to increase the signal level of the dynamic reference signal in reaction to the switchover of the control signal in the manner of an abrupt jump.

In a seventh device in accordance with the fifth or sixth device, the passive charging circuit is further configured such that the capacitance of the RC element charges following a switchover of a control signal of the power semiconductor switch from an ON state into an OFF state.

In an eighth device in accordance with the fourth device or the fourth device and any of the fifth to seventh devices, the passive charging circuit is configured such that the capacitance of the RC element discharges following the switchover of the control signal and thus produces the temporarily increased level of the dynamic reference signal and returns it to the steady-state level again as a result of the discharge.

In a ninth device in accordance with the eighth device, a 1/e time constant of the RC element is greater than 1 μs.

In a tenth device in accordance with the eighth device, a 1/e time constant of the RC element is between 5 and 15 μs.

In an eleventh device in accordance with any of the preceding devices, the reference signal generator contains a circuit for producing the steady-state signal level.

In a twelfth device in accordance with the eleventh device, the circuit for producing the steady-state signal level comprises one or more resistors and an input for receiving a constant current, wherein the circuit for producing the steady-state signal level is configured to conduct the constant current through the one or more resistors, such that a steady-state reference voltage is dropped across the one or more resistors in order to produce the steady-state signal level.

In a thirteenth device in accordance with the twelfth device, the one or more resistors are coupled to a first internal reference level.

In a fourteenth device in accordance with the thirteenth device, wherein the first internal reference level corresponds to an emitter voltage, a cathode voltage or a source voltage of the power semiconductor switch.

In a fifteenth device in accordance with any of the preceding devices, the device further comprises a first clamping circuit, which is configured to limit the dynamic reference voltage to a predetermined minimum level.

In a sixteenth device in accordance with the fifteenth device, the minimum level corresponds to an emitter voltage, a cathode voltage or a source voltage of the power semiconductor switch.

In a seventeenth device in accordance with the fifteenth device, the minimum level is less than or equal to the steady-state signal level.

In an eighteenth device in accordance with any of the preceding devices, the device further comprises a second clamping circuit, which is configured to restrict the dynamic reference voltage to a predetermined maximum level.

In a nineteenth device in accordance with the eighteenth device, the maximum level corresponds to a signal level of the control signal in the ON state.

In a twentieth device in accordance with any of the preceding devices, the device further comprises a passive switch, which is coupled between the reference signal generator and the passive charging circuit, wherein the passive switch is configured to isolate the reference signal generator and the passive charging circuit in reaction to a switchover of the control signal of the power semiconductor switch from an ON state into an OFF state.

In a twenty-first device in accordance with any of the preceding devices, the predetermined time is between 4 and 25 μs.

In a twenty-second device in accordance with any of the preceding devices, the predetermined time is between 8 and 15 μs.

In a twenty-third device in accordance with any of the preceding devices, the passive charging circuit is configured to increase a signal level of the dynamic reference signal in reaction to a switchover of a control signal of the power semiconductor switch from an OFF state into an ON state for the entire predetermined time above the steady-state signal level in order to produce the dynamic reference signal.

In a twenty-fourth device in accordance with any of the preceding devices, the dynamic reference signal is a voltage signal.

In a twenty-fifth device in accordance with any of the first to twenty-third devices, the dynamic reference signal is a current signal.

In a twenty-fifth device in accordance with the eleventh device or the eleventh device and any of the preceding devices, the circuit for producing the steady-state signal level comprises an input for receiving a constant voltage.

In a twenty-sixth device in accordance with any of the preceding devices, an internal reference level of the device forms the steady-state signal level.

A first control circuit for a power semiconductor switch in accordance with one example of the invention comprises a device for producing a dynamic reference signal for a control circuit for a power semiconductor switch in accordance with any of the first to twenty-sixth devices, a short-circuit and/or overcurrent state detection circuit, which receives a dynamic reference signal from the device for producing a dynamic reference signal and a signal representative of a collector-emitter voltage, a signal representative of an anode-cathode voltage or a signal representative of a drain-source voltage of the power semiconductor switch and is configured to compare the dynamic reference signal with the signal representative of a collector-emitter voltage, an anode-cathode voltage or a drain-source voltage in order to produce a fault signal indicating a presence of a short-circuit and/or overcurrent state in the power semiconductor switch, and a driver circuit, which receives the fault signal and is configured to switch off the power semiconductor switch if the fault signal indicates the presence of a short-circuit and/or overcurrent state in the power semiconductor switch.

In a second control circuit in accordance with the first control circuit, the short-circuit and/or overcurrent state detection circuit indicates the presence of a short-circuit and/or overcurrent state in the power semiconductor switch if the signal representative of a collector-emitter voltage, an anode-cathode voltage or a drain-source voltage is greater than the dynamic reference signal.

In a third control circuit in accordance with the first or second control circuit and the of one of the eleventh to thirteenth devices, the driver circuit further comprises the current source for producing the constant current.

A first device for providing electrical energy comprises one or a plurality of inputs for connection to a source of electrical energy, one or a plurality of outputs for connection of one or a plurality of loads, one of the first to third control circuits and a power semiconductor switch controlled by the control circuit, wherein the device is configured to transmit electrical energy by control of the power semiconductor switch from the one or the plurality of inputs to the one or the plurality of outputs.

In a second device for providing electrical energy in accordance with the first device for providing electrical energy, the power semiconductor switch is an IGBT or a reverse blocking IGBT.

In a third device for providing electrical energy in accordance with the first device for providing electrical energy, the power semiconductor switch is a GTO, an IEGT, a MOSFET or a bipolar transistor.

In a fourth device for providing electrical energy in accordance with any of the first to third devices for providing electrical energy and the fourth device, the capacitance of the RC element discharges with a time constant selected in order to prevent the short-circuit and/or overcurrent state detection circuit from detecting a short-circuit and/or overcurrent state in normal operation.

In a fifth device for providing electrical energy in accordance with any of the first to fourth devices for providing electrical energy and the fourth device, the capacitance of the RC element discharges with a time constant selected in order to ensure that the short-circuit and/or overcurrent state detection circuit detects a short-circuit and/or overcurrent state in the short-circuit and/or overcurrent case.

In a sixth device for providing electrical energy in accordance with any of the first to fifth devices for providing electrical energy, the control circuit further comprises a second power semiconductor switch, a second control circuit for the second power semiconductor switch, wherein the second control circuit comprises a second device for producing a dynamic reference signal for a control circuit for the second power semiconductor switch in accordance with any of the devices 1 to 25, a second short-circuit and/or overcurrent state detection circuit, which receives a dynamic reference signal from the second device for producing a dynamic reference signal and a signal representative of a collector-emitter voltage, or the signal representative of a collector-emitter voltage, an anode-cathode voltage or a drain-source voltage of the power semiconductor switch and is configured to compare the dynamic reference signal with the signal representative of a collector-emitter voltage, an anode-cathode voltage or a drain-source voltage in order to produce a second fault signal indicating a presence of a short-circuit and/or overcurrent state in the second power semiconductor switch, and a second driver circuit, which receives the second fault signal and is configured to switch off the second power semiconductor switch if the fault signal indicates the presence of a short-circuit and/or overcurrent state in the power semiconductor switch.

In a seventh device for providing electrical energy in accordance with the sixth device for providing electrical energy, the first and second power semiconductor switches are connected in series and the device is configured to the effect that a load is coupled between the first and second power semiconductor switches and an input voltage is applied via the series-connected first and second power semiconductor switches.

In an eighth device for providing electrical energy in accordance with the seventh device for providing electrical energy, the first and second power semiconductor switches are configured to carry a voltage of between 100 V and 15 kV.

A method for producing a dynamic reference signal for a power semiconductor switch in accordance with one example of the invention, wherein the method comprises producing a steady-state reference signal, receiving a control signal of the power semiconductor switch, increasing a level of the steady-state reference signal in reaction to a switchover of a control signal of the power semiconductor switch from an OFF state into an ON state for at least one part of the predetermined time using a passive circuit, and outputting the dynamic reference signal.

BRIEF DESCRIPTION OF THE FIGURES

Non-limiting and non-exhaustive exemplary embodiments of the invention are described with reference to the following figures, wherein identical reference signs refer to identical component parts in the various figures, unless specified otherwise.

DETAILED DESCRIPTION

Figure 1:
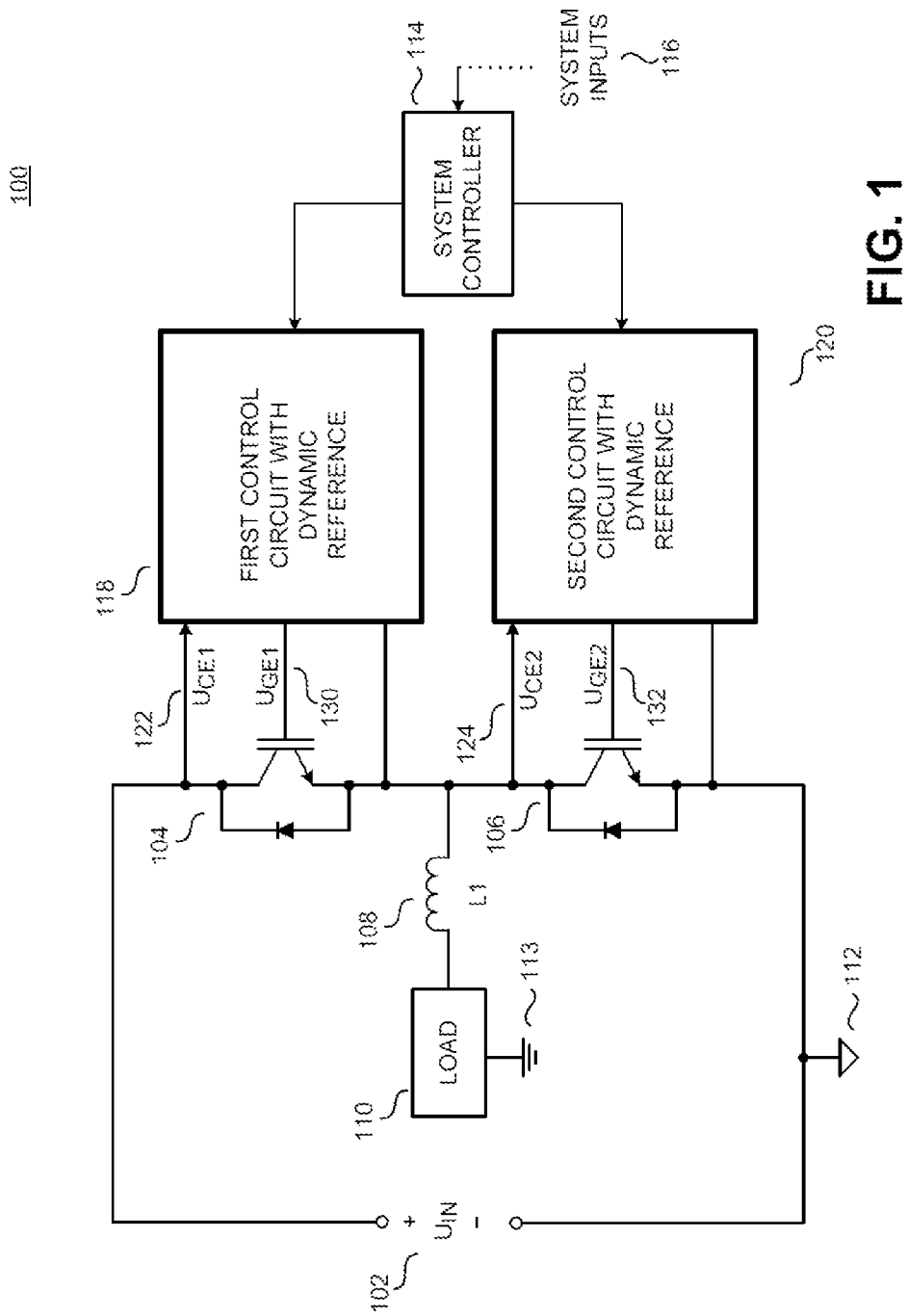
FIG. 1 shows a device for providing electrical energy to a load.

The following description presents numerous details to enable a profound understanding of the present invention. It is clear to the person skilled in the art, however, that the specific details are not necessary to implement the present invention. Elsewhere, known devices and methods are not portrayed in detail, in order that understanding the present invention is not made more difficult unnecessarily.

In the present description, a reference to "an embodiment", "a configuration", "an example" or "example" means that a specific feature, a structure or property that is described in association with this embodiment is included in at least one embodiment of the present invention. In this regard, the phrases "in one embodiment", "an example" or "example" at various points in this description do not necessarily all refer to the same embodiment or the same example. Furthermore, the specific features, structures or properties can be combined in arbitrary suitable combinations and/or subcombinations in one or more embodiments or examples. Particular features, structures or properties can be included in an integrated circuit, in an electronic circuit, in a circuit logic or in other suitable component parts which provide the functionality described. Furthermore, it is pointed out that the drawings serve the purpose of elucidation for the person skilled in the art, and that the drawings are not necessarily drawn in a manner true to scale.

The above-described differences in the profile of the collector-emitter voltage between normal operation and short-circuit and/or overcurrent operation can be utilized in protective circuits in order to detect a short-circuit or overcurrent state. By way of example, if the collector-emitter voltage rises above the threshold value (see FIG. 6, bottom right), a short-circuit or overcurrent state can be detected. However, the fall in the collector-emitter voltage need not be monotonic. As likewise illustrated in FIG. 6, said fall can have voltage peaks and voltage valleys—precisely just after the switch-on of the power semiconductor switch. In the case of a static reference voltage that can have the effect that the protective circuit erroneously assumes a short-circuit and/or overcurrent case and switches off the power semiconductor switch. Likewise, in the case of power semiconductor switches having a comparatively sluggish switchover behavior, the time until a static state is reached may be comparatively long (e.g. significantly longer than 10 µs). A static reference voltage that is set near a specific static forward voltage of the power semiconductor switch can thus likewise have the effect that the protective circuit erroneously assumes a short-circuit and/or overcurrent case and switches off the power semiconductor switch. In this case, the protective circuit may detect a dangerously increased voltage even though the voltage level increased at a specific point in time should merely be ascribed to the inertia of the power semiconductor switch.

FIG. 1 shows a device 100 (also designated as power converter) for providing electrical energy to a load 110. However, the flow of energy can also point in the other direction. Element 110 is then a generator. In still other devices, element 110 in different operating states can operate both as load and as generator. Hence reference is made merely to a device for providing energy, which encompasses all the cases just discussed (the energy can be provided at different outputs). The device comprises two power semiconductor switches 104, 106, which are connected in series. In addition, device 100 can receive a DC input voltage 102 ($U_{IN}$). The device is configured to transmit electrical energy by the control of the power semiconductor switches 104, 106 from the input to an output to which the load 110 is connected (or in the opposite direction). In this case, the device for providing electrical energy can control voltage levels, current levels or a combination of both quantities that are output to the load.

In the example in FIG. 1, the power semiconductor switches 104, 106 are IGBTs. Hence the devices and methods are explained on the basis of the example of IGBTs. However, the devices for producing a dynamic reference signal, the control circuits and the devices according to the invention for providing electrical energy are not restricted to the use with IGBTs. Rather, they can also be used in combination with other power semiconductor switches. By way of example, metal oxide semiconductor field effect transistors (MOSFETs), bipolar transistors, IEGTs ("injection enhancement gate transistors") and GTOs ("gate turn-off thyristors") can be used with the devices for producing a dynamic reference signal, the control circuits and the devices according to the invention for providing electrical energy. Moreover, the devices for detecting a profile of a voltage across a power semiconductor switch, the control circuits and the devices for providing electrical energy can be used with power semiconductor switches which are based on gallium nitride (GaN) semiconductors or silicon carbide (SiC) semiconductors.

A maximum nominal collector-emitter, anode-cathode or drain-source voltage of a power semiconductor switch in the switched-off state can be more than 500 V, preferably more than 2 kV.

In addition, the devices for producing a dynamic reference signal, the control circuits and the devices according to the invention for providing electrical energy are not restricted to power semiconductor switches. In this regard, it is also possible to use other semiconductor switches with the devices for detecting a profile of a voltage across a power semiconductor switch, the control circuits and the devices for providing electrical energy. The effects and advantages which are discussed here also occur at least in part in systems with other semiconductor switches.

Since IGBTs are thus discussed, the terminals of the power semiconductor switch are designated as "collector", "gate" and "emitter". As already explained above, however, the devices and methods are not restricted to IGBTs. In order to avoid unnecessary lengths, the designation "emitter" herein also encompasses the terminal of corresponding power semiconductor switches that is designated by "source" or "cathode". Equally, the term "collector" herein also encompasses the terminal designated by "drain" or "anode", and the term "gate" encompasses the terminal of corresponding power semiconductor switches that is designated by "base". Hence the term "collector-emitter voltage" also encompasses a "drain-source voltage" and a "cathode-anode voltage", and the terms "collector voltage" and "emitter voltage" also encompass a "drain voltage" or "anode voltage" and respectively a "source voltage" or "cathode voltage".

The power semiconductor switches 104, 106 are respectively controlled by a first and second control circuit 118, 120 (an exemplary control circuit is explained in connection with FIG. 2). Said control circuits provide a first and a second gate-emitter driver signal 130, 132 ($U_{GE1}$, $U_{GE2}$) in order to control the switching instants of the first and second IGBTs. Both control circuits 118, 120 can optionally be controlled in turn by a system controller 114. The system controller 114 can have an input for receiving system input signals 116. Two power semiconductor switches 104, 106 in a half-bridge configuration are illustrated in the example in FIG. 1. The devices for producing a dynamic reference signal, the control circuits and the devices for providing electrical energy can also be used in other topologies, however. By way of example, an individual power semiconductor switch (e.g. an individual IGBT) can be connected up to a device for producing a dynamic reference signal or a control circuit. In other examples, in a three-phase system having six power semiconductor switches or twelve power semiconductor switches, each of the power semiconductor switches can have a device for producing a dynamic reference signal.

Besides outputting a gate-emitter driver signal, the control circuits 118, 120 take up signals representing voltages present across the power semiconductor switches 104, 106. The signals can be voltage signals or current signals. In the example in FIG. 1, each control circuit 118, 120 has a respective signal that is representative of the collector-emitter voltage and is designated as collector-emitter voltage signal 122, 124 ($U_{CE1}$, $U_{CE2}$).

In FIG. 1 and subsequently, circuits are described which use signals representing voltages present across the power semiconductor switches 104, 106 (for example a collector-emitter voltage signal). As explained further above, the indirect monitoring of the current through the power semiconductor switch can be effected on the basis of the voltages present across a power semiconductor switch. However, a current through the power semiconductor switch (e.g. a collector current, a drain current or a cathode current) can also be estimated in some other way or be directly measured. In one example, a device (also designated as power converter) for providing electrical energy to a load can have a detection circuit for directly measuring a current through a power semiconductor switch (e.g. a device for measuring a collector current).

In FIG. 1, the control circuits 118, 120 are schematically depicted as separate control circuits. However, both control circuits 118, 120 can also be combined in a single circuit. In this case, a single control circuits controls two power semiconductor switches 104, 106. Furthermore, the second gate-emitter driver signal 132 ($U_{GE2}$) can be an inverted first gate-emitter driver signal 130 ($U_{GE1}$).

Both control circuits 118, 120 comprise a device for producing a dynamic reference signal. With the aid thereof, on the basis of the respective collector-emitter voltage signal 122, 124 it is possible to ascertain a short-circuit and/or overcurrent state of the respective power semiconductor switch. In reaction to ascertaining a short-circuit and/or overcurrent state, the respective power semiconductor switch 104, 106 can be switched off.

Figure 2:
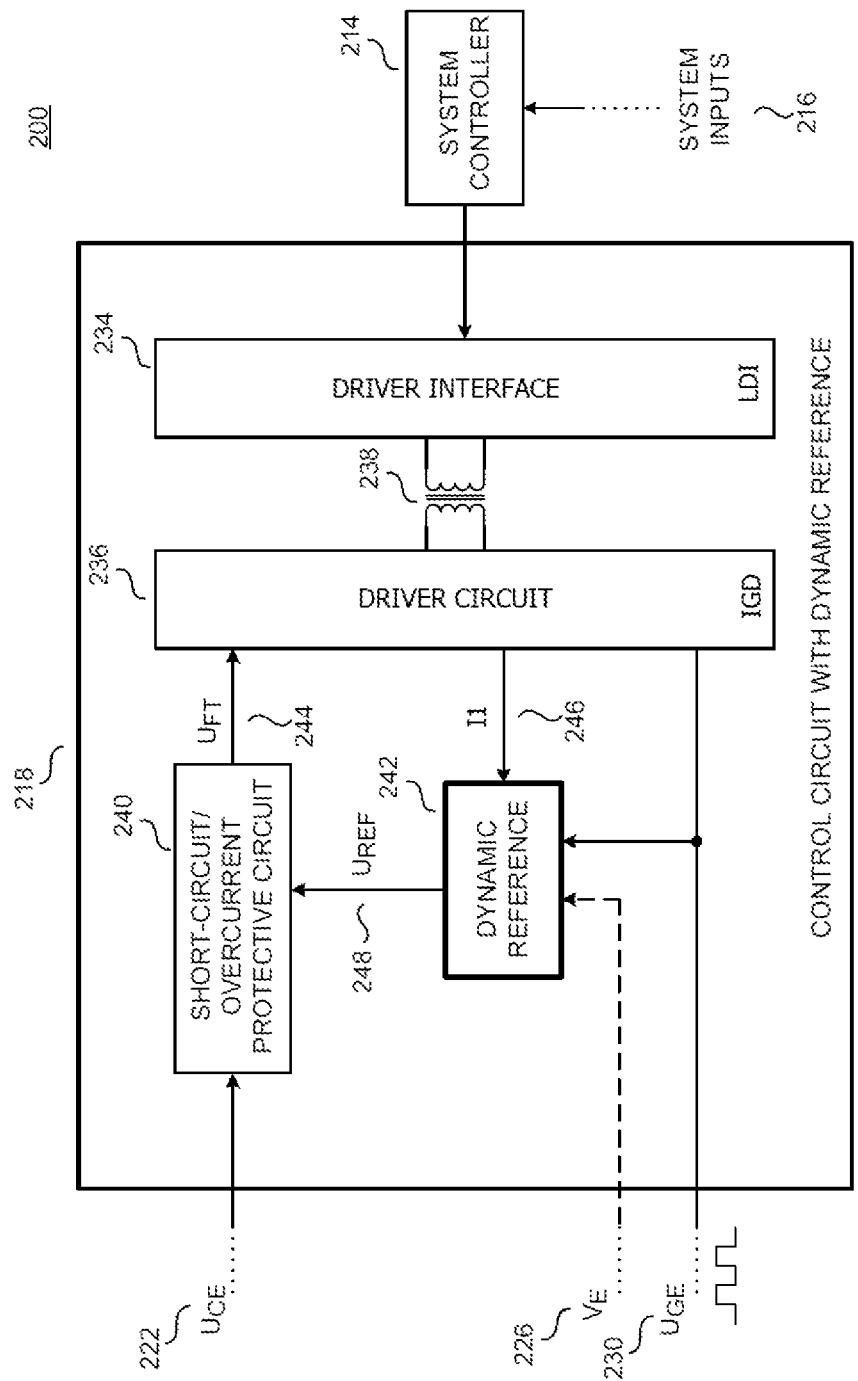
FIG. 2 illustrates an exemplary control circuit.

FIG. 2 illustrates a control circuit 218 (for example one of the control circuits 118, 120 from FIG. 1). The control circuit 218 includes four functional units: a device for producing a dynamic reference signal 242, a short-circuit and/or overcurrent state detection circuit 240, a driver circuit 236 and an optional driver interface 234. The device for producing a dynamic reference signal 242 is adapted to receive a gate-emitter driver signal 230 from the driver circuit 236. However, a device for producing a dynamic reference signal 242 can also receive other signals representative of the gate-emitter driver signal 230. It is merely necessary that information regarding the point in time of a switchover process of the controlled power semiconductor switch from a switched-off state into a switched-on state can be inferred from the signal (and optionally information regarding the point in time of a switchover process of the controlled power semiconductor switch from a switched-on state into a switched-off state). In addition, the device for producing a dynamic reference signal 242 is optionally configured to receive an external reference signal. In the example in FIG. 2, the external reference signal can be a reference signal 226 that is representative of the emitter voltage of a power semiconductor switch. However, alternatively, as external reference signal it is also possible to use other voltage levels that are offset by a constant offset relative to the emitter voltage of a power semiconductor switch.

In addition, the device for producing a dynamic reference signal 242 is configured to receive a constant-current signal 246 ($I_1$). In the example in FIG. 2, the constant-current signal 246 is provided by the driver circuit 236. The constant-current signal 246, too, can alternatively be provided by other functional units of the control circuit 218 or else by an external source or be produced internally by the circuit for producing the reference signal itself. Any suitable source of current is appropriate for producing the constant current 246.

On the basis of the received signals (that is to say the constant-current signal 246 and the gate-emitter driver signal 230), the device for producing a dynamic reference signal 242 provides a dynamic reference signal 248. The latter is received by the short-circuit and/or overcurrent state detection circuit 240. The dynamic reference signal 248 has a steady-state signal level after a predetermined time has elapsed after a switchover process of the power semiconductor switch. If the power semiconductor switch switches from an OFF state into an ON state, the dynamic reference signal 248 is increased above the steady-state signal level at least in a part of a time period starting from the switchover process of the power semiconductor switch until the predetermined time has elapsed. However, the steady-state signal level of the dynamic reference signal need not be identical in all operating situations. In this regard, drifting or a slow variation of the steady-state signal level in relation to a length of a switching cycle is possible. Moreover, the steady-state signal level can be settable.

The short-circuit and/or overcurrent state detection circuit 240, for its part, is configured to receive a signal 222 corresponding to the collector-emitter voltage $U_{CE}$ of a power semiconductor switch (for example signals 122 or 124 from FIG. 1). On the basis of said signal 222 corresponding to the collector-emitter voltage of the power semiconductor switch, the short-circuit and/or overcurrent state detection circuit 240 determines a signal representative of a collector-emitter voltage across the power semiconductor switch ($U_{C'E}$). In other examples, the short-circuit and/or overcurrent state detection circuit 240 determines said signal from other signals or receives a signal representative of a collector-emitter voltage across the power semiconductor switch from a further circuit block. In further examples, the short-circuit and/or overcurrent state detection circuit 240 receives a signal representative of a current through the power semiconductor switch (e.g. a collector current). As explained in connection with FIG. 1, the signal representative of a current through the power semiconductor switch can be produced by a direct measurement of the current through the power semiconductor switch. The short-circuit and/or overcurrent state detection circuit 240 can then compare the signal representative of a current through the power semiconductor switch with the dynamic reference signal in order to detect a presence of a short-circuit and/or overcurrent state in the power semiconductor switch. Exemplary profiles of a signal representative of a current through the power semiconductor switch are shown at the bottom in FIG. 6 (on the basis of the example of the collector current $I_{C'}$), where it can also be discerned that the normal and short-circuit and/or overcurrent states can be detected both directly from a characteristic change in the profile of the current and indirectly from a characteristic change in the profile of the voltage.

In response to the received or determined signal representative of a collector-emitter voltage across the power semiconductor switch (or a received or determined signal representative of the collector current through the power semiconductor switch) and the received dynamic reference signal 248, the short-circuit and/or overcurrent state detection circuit 240 determines whether a short-circuit and/or overcurrent state is present.

Figure 6:
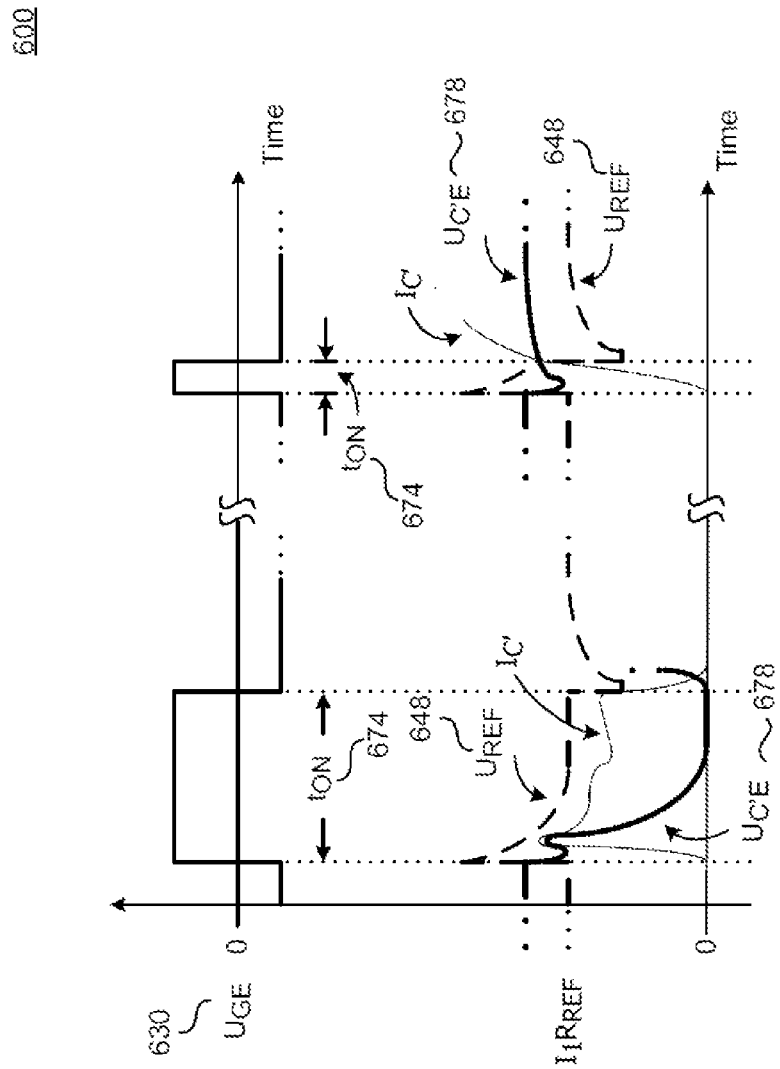
FIG. 6 shows various signals for providing electrical energy to a load from FIG. 1 in a normal state and in a short-circuit and/or overcurrent state.

In one example, the short-circuit and/or overcurrent state detection circuit 240 detects that a short-circuit and/or overcurrent state is present if the signal representative of the collector-emitter voltage (or the signal representative of the collector current through the power semiconductor switch) is greater than the dynamic reference signal 248. As already described further above, the collector-emitter voltage (or the collector current) should fall rapidly to a relatively low value after the power semiconductor switch has been switched on, and a collector-emitter voltage increased above said value (or an increased collector current) is an indirect (or direct) indicator of the presence of a short-circuit and/or overcurrent state. The lower curves in FIG. 6 illustrate this and the operation of the short-circuit and/or overcurrent state detection circuit 240. A normal switch-on process is illustrated on the left-hand side of FIG. 6. The voltage $U_{C'E}$ (in this case the signal representative of the collector-emitter voltage) falls rapidly after the switching process. The current $I_{C'}$ (in this case the signal representative of the collector current) likewise quickly reaches a more or less steady-state level. The dynamic reference signal always lies above the signal $U_{C'E}$ 678 (or above a signal representative of the collector current), such that no short-circuit and/or overcurrent state is ascertained. As already mentioned, the temporary increase in the level of the dynamic reference signal after the switchover process can prevent an erroneous detection of a short-circuit and/or overcurrent state.

By contrast, FIG. 6 schematically depicts at the bottom on the right-hand side a typical profile of the signal representative of the collector-emitter voltage and the profile of the signal representative of the collector current in a short-circuit and/or overcurrent case. It can be discerned here that the signal $U_{C'E}$ 678 and the signal $I_{C'}$ exceed the dynamic reference signal (e.g. after 8 to 12 μs after a switchover process) and the short-circuit and/or overcurrent state detection circuit 240 thus detects a short-circuit and/or overcurrent state. As explained above, the dynamic reference signal is increased for at least one part of a predetermined time (for example for the entire predetermined time), such that no fault is detected if during the predetermined time voltage peaks and voltage valleys occur after the switch-on of the power semiconductor switch, or the complete falling of the signal representative of the collector-emitter voltage to a low value below the static reference signal takes longer, in principle, than the maximum permissible short-circuit duration defined for the power semiconductor switch. The duration of the increase in the dynamic reference signal can be set in order to minimize the frequency of the occurrence of incorrect fault detections. As can be seen in FIG. 6, a sufficiently great rise in the signal representative of the collector-emitter voltage or in the signal representative of the collector current through the power semiconductor switch, despite the dynamic increase in the reference signal during the predetermined time, can trigger the detection of a short-circuit and/or overcurrent state. It may just be that the point in time of the detection is shifted back by the dynamic increase in the reference signal.

The overcurrent state detection circuit 240, if it has detected a short-circuit and/or overcurrent state, can output a fault signal. In the example in FIG. 2, a fault signal 244 ($U_{FT}$) is output to the driver circuit 236. The latter can switch off the power semiconductor switch in reaction to the fault signal 244, in order to prevent damage to said power semiconductor switch. However, in alternative arrangements, the fault signal can also be processed in some other way. By way of example, it is possible just to supply the fault signal 250 ($U_{FT}$) to a further control element (for example to the system controller 214). Said further element can then switch off two or more power semiconductor switches in a predetermined sequence.

In order to determine the fault signal, the short-circuit and/or overcurrent state detection circuit 240 can process further the received signals. By way of example, the short-circuit and/or overcurrent state detection circuit 240 can comprise a gating circuit in order to set a predetermined delay of the detection of a short-circuit and/or overcurrent state. Additionally or alternatively, the short-circuit and/or overcurrent state detection circuit 240 can contain a circuit for setting a voltage level of the signal representative of the collector-emitter voltage (or of a signal representative of the collector current of the power semiconductor switch). Since the collector-emitter voltage itself can be a few thousand volts or more, this circuit can comprise a network having high-value resistors. However, the network can also comprise further elements configured for high voltages (e.g. capacitive components or diodes). This produces from the collector-emitter voltage a signal that is proportional to the collector-emitter voltage but has a (much) lower voltage level (for example the signal $U_{C'E}$ depicted schematically in FIG. 6).

As already described, the driver circuit 236 can receive a fault signal 244 signaling a short-circuit and/or overcurrent state and can switch off the power semiconductor switch in reaction to a detected short-circuit and/or overcurrent state. One or a plurality of components of the short-circuit and/or overcurrent state detection circuit 240 can optionally be included in the driver circuit 236. By way of example, the driver circuit 236 can receive the dynamic reference signal $U_{REF}$ 248 and the signal representative of the collector-emitter voltage (or a signal representative of the collector current through the power semiconductor switch). In addition, the driver circuit 236 can also supply a gate-emitter driver signal for controlling the power semiconductor switch.

In the example in FIG. 2, the driver circuit 236 is connected via a galvanic isolation 238 (e.g. a transformer) to the optional driver interface 234, in order to receive control signals from the system controller 214. The driver interface 234 can in turn be connected to the system controller 214, which receives system inputs 216, and is controlled thereby.

Figure 3:
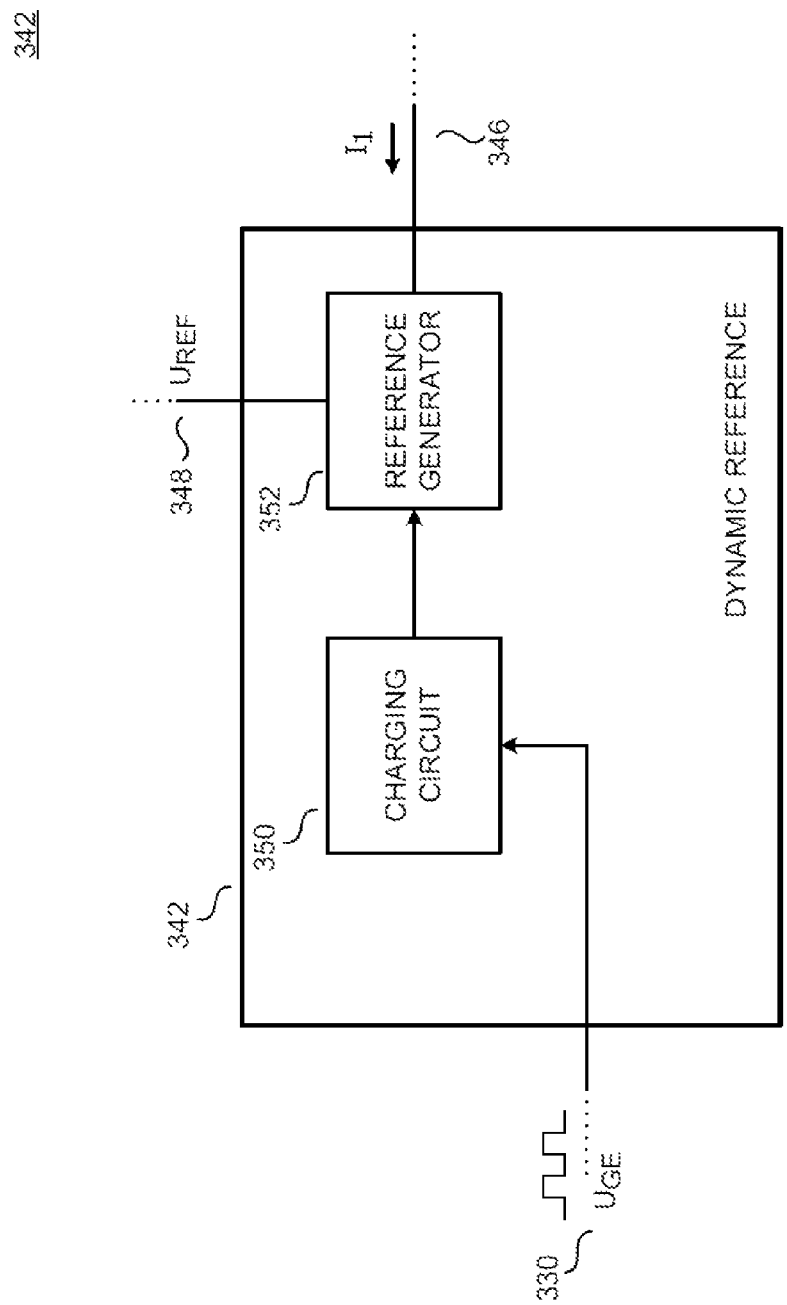
FIG. 3 shows an exemplary device for producing a dynamic reference signal.

FIG. 3 illustrates an exemplary device for producing a dynamic reference signal 342 (for example block 242 in FIG. 2) for a control circuit for a power semiconductor switch. The device for producing a dynamic reference signal 342 contains two functional blocks, a reference signal generator 352 and a passive charging circuit 350. The function of these blocks will be explained below. However, the exemplary circuit is not restricted to cases in which the functions explained below are performed in separate units. Rather, a portion or all of the functions of a block can also be implemented jointly.

The device for producing a dynamic reference signal 342 receives a control signal of the power semiconductor switch 330 ($U_{GE}$) and a constant-current signal 346 ($I_1$).

In FIG. 3 and in the subsequent figures, the devices for producing a dynamic reference signal receive a constant-current signal. As already explained further above, other configurations are also possible. In one example, the devices for producing a dynamic reference signal receives a constant-voltage signal.

The control signal of the power semiconductor switch 330 ($U_{GE}$) can be any signal representing the temporal sequence of the switchover processes of the power semiconductor switch. By way of example, as shown in FIG. 1, the gate driver signal can be used. However, (primarily in a complex IGBT driver circuit) a suitable signal can also be present elsewhere in order to supply the device for producing a dynamic reference signal 342 with information about the switchover processes of the power semiconductor switch. The constant-current signal 346 (or a constant-voltage signal) can also be produced in the device for producing a dynamic reference signal 342 itself.

The reference signal generator 352 of the device for producing a dynamic reference signal 342 makes available a dynamic reference signal 348 ($U_{REF}$ or $I_{REF}$) having a steady-state signal level after a predetermined time has elapsed after a switchover process of the power semiconductor switch. By way of example, the reference signal generator 352 can comprise one or a plurality of components for producing the steady-state signal level in response to the constant-current signal 346 (or a constant-voltage signal). Examples of the reference signal generator 352 are shown in connection with FIG. 4A, FIG. 4B and FIG. 7.

The passive charging circuit 350 is configured to increase an around a signal level of the dynamic reference signal in reaction to a switchover of a control signal of the power semiconductor switch from an OFF state into an ON state at least for a part of the predetermined time (for example for the entire predetermined time) above the steady-state signal level in order to produce a dynamic reference signal. By way of example, the passive charging circuit 350 receives the control signal $U_{GE}$ 330. The control signal $U_{GE}$ 330 is processed by the passive charging circuit 350 in order to determine the point in time of the switchover process of a control signal of the power semiconductor switch from a switched-off state into a switched-on state. In addition, the amplitude and the temporal profile (that is to say also the length of the part of or of the entire predetermined time in which the dynamic reference signal 348 has an increased signal level) of the increase in the dynamic reference signal above the steady-state signal level can be determined at least in part on the basis of the control signal $U_{GE}$ 330. This temporary increase in the dynamic reference signal is brought about by the passive charging circuit 350 without active components (such as transistors, for example). Exemplary passive charging circuits 350 are in turn shown in connection with FIG. 4A, FIG. 4B and FIG. 7.

In one example, the passive charging circuit 350 is configured to control at least in part the temporal profile of the temporary increase in the dynamic reference signal as illustrated in FIG. 6. That comprises an abrupt rise in reaction to a switchover of a control signal of the power semiconductor switch from an OFF state into an ON state followed by a continuous fall back to the level of the steady-state voltage signal. The time constant (1/e time constant) of the fall can be between 1 and 50 µs (e.g. between 5 and 15 µs). In order to produce this temporal behavior of the dynamic reference signal 348, the passive charging circuit 350 can contain an RC element, wherein the time constant of a capacitance of the RC element determines at least in part the speed of the fall to levels of the steady-state voltage signal. In addition, the rise in the level of the dynamic reference signal 348 above the level of the steady-state reference signal can correlate with a jump in the amplitude of the control signal $U_{GE}$ 330. Exemplary signal levels are explained in connection with FIG. 6.

Figure 4A:
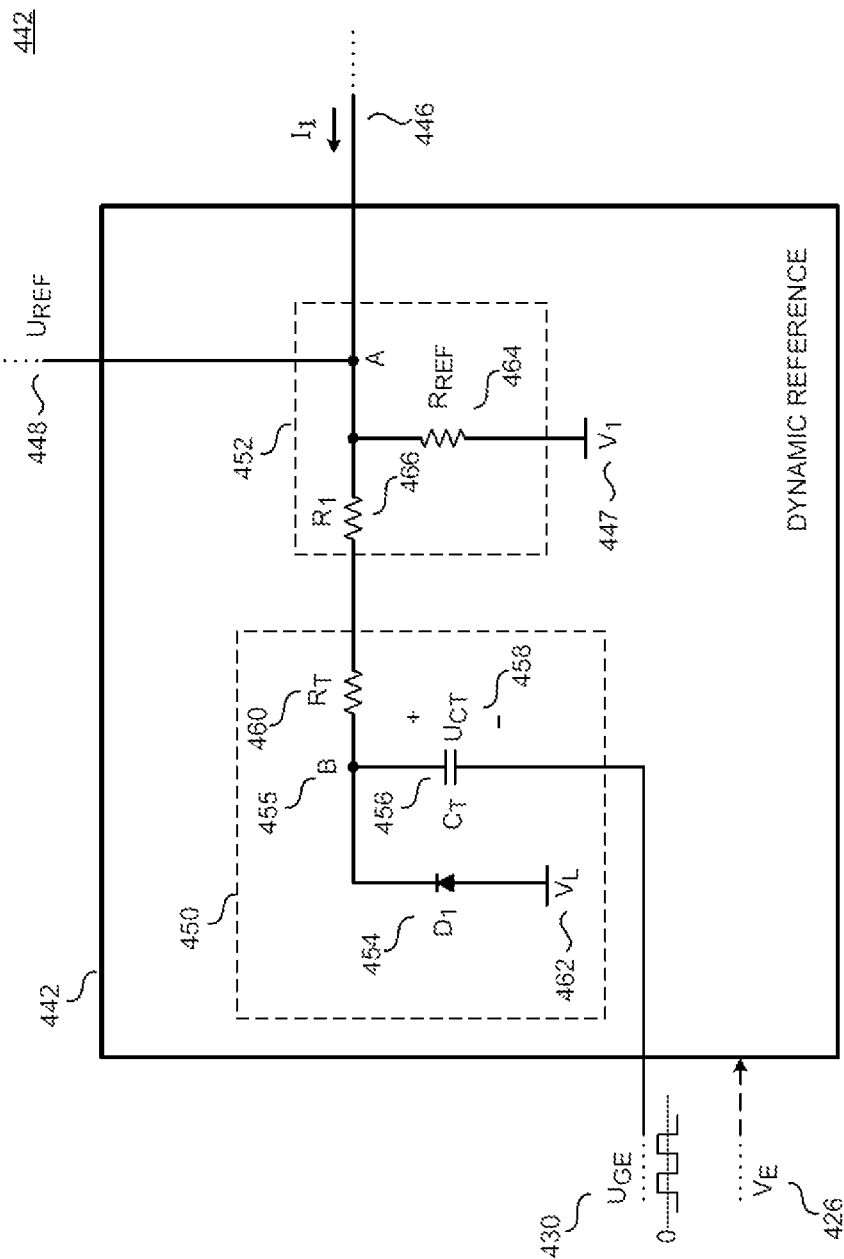
FIG. 4A shows an example of a device for producing a dynamic reference signal.

FIG. 4A shows a first example of a of a device for producing a dynamic reference signal 442. The device contains a reference signal generator 452 and a passive charging circuit 450. In addition, the device for producing a dynamic reference signal 442, as also in the example in FIG. 3, receives a control signal of the power semiconductor switch 430 ($U_{GE}$), a constant-current signal 446 ($I_1$). With regard to the selection of these signals and alternative signals, the statements made at the corresponding point in the description of FIG. 3 are applicable.

Reference signal generator 452 contains a circuit for producing a static reference signal. The circuit for producing a static reference signal includes a reference resistor 464 ($R_{REF}$). The constant-current signal 346 is coupled to a first terminal of the reference resistor 464, flows through the reference resistor 464 and thus produces a constant voltage drop ($I_1 * R_{REF}$). Even though the reference resistor 464 is illustrated as an individual component in FIG. 4A, a combination of a plurality of resistors can also be used.

In other examples, it is possible to use a constant-voltage source in the devices for producing a dynamic reference signal (instead of producing the latter by the fall in the constant current $I_1$ across the reference resistor $R_{REF}$ 464). In one example, a constant voltage source can be connected in series with the reference resistor $R_{REF}$ 464 (as it were instead of $V_1$). For example, the constant voltage source can be connected between the reference resistor $R_{REF}$ and $V_E$. In other examples, an internal reference level already present in the devices for producing a dynamic reference signal here can form the static voltage reference level (e.g. the internal reference level 447 ($V_1$)). For example, the internal reference level can be produced by a passive semiconductor circuit (e.g. with a zener diode). In another example, the reference resistor $R_{REF}$ 464 can be omitted. The devices for producing a dynamic reference signal then produces a reference current $I_{REF}$ (instead of a reference voltage $U_{REF}$).

The device for producing a dynamic reference signal 442 produces a first internal reference level 447 ($V_1$). For example, the first internal reference level 447 ($V_1$) can be produced on the basis of the reference level 426 or correspond thereto. In one example, the first internal reference level 447 is substantially equal to the emitter voltage of the power semiconductor switch. That is advantageous since typically a reference signal representative of the emitter voltage is likewise used in short-circuit and/or overcurrent state detection circuits (see block 240 in FIG. 2). Consequently, in this case both a collector-emitter voltage signal and a dynamic reference signal, which are compared with one another, are referenced to the same signal. That can facilitate the mutual stabilization of the signals. Nevertheless, any level lying below the static voltage reference level is usable for the first internal reference level 447 ($V_1$).

Figure 5A:
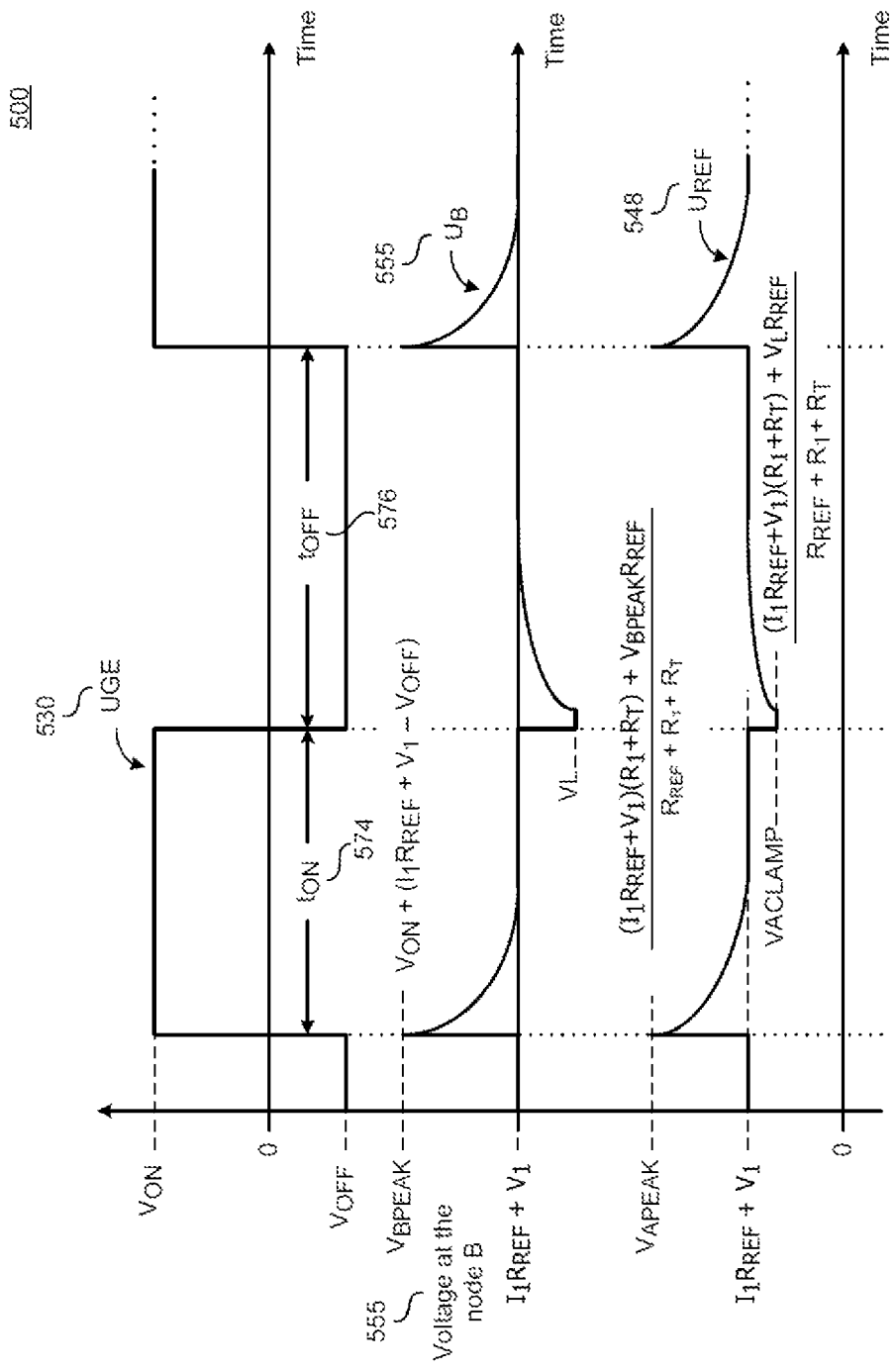
FIG. 5A shows various signals in the device for producing a dynamic reference signal from FIG. 4A.

The node A of the reference signal generator 452 which is connected to an output for outputting the dynamic reference signal 448 is thus raised to a steady-state signal level by the circuit for producing the steady-state signal level. In FIG. 4A and the subsequent figures, the dynamic reference signal 448 ($U_{REF}$) is a dynamic voltage signal. However, as already explained a number of times, a dynamic current signal can also be used. This steady-state signal level is $V_1 + R_{REF} * I_1$ in the exemplary device in accordance with FIG. 4A. If the voltage level of the node A is not influenced by the passive charging circuit 450, the the level of the dynamic reference signal 448 corresponds to the steady-state signal level (that is to say $V_1 + R_{REF} * I_1$). This behavior is illustrated in FIG. 5A. The bottommost curve represents an exemplary profile of the voltage at the node A (and thus of the dynamic reference signal 548). It can be seen that the voltage level at the node A is in the steady state apart from specific times following the switchover processes of the semiconductor switch.

The passive charging circuit 450 is connected to the reference signal generator 452 via resistor 466 ($R_1$) (the latter is depicted as being associated with the reference signal generator 452 in FIG. 4A, but that is an arbitrary classification). The passive charging circuit 450 contains an RC element. The latter comprises a capacitance 456 ($C_T$)

and a resistor 460 (R$_T$). The capacitance 456 is coupled between a node B and an input that receives the control signal of the power semiconductor switch 430. The resistor 460 is coupled between the node B and the node A of the reference signal generator 452. The resistors 460 and 466 can also be an individual resistor.

Moreover, the passive charging circuit 450 contains an optional first clamping circuit 454, which limits a voltage level at the node B to a second internal reference level 462 (V$_L$). In the example in FIG. 4A, the first clamping circuit 454 contains a diode 454. The second internal reference level 462 can be any level that is less than or equal to the static voltage reference level. If the external reference level 426 fulfills this condition, it can be used as second internal reference level 462. The second internal reference level 462 can thus in turn be representative of the emitter voltage of the power semiconductor switch. The passive charging circuit 450 contains no active components.

The function of the passive charging circuit will be explained again with reference to FIG. 5A. As already discussed, the device for producing a dynamic reference signal 442 outputs directly before a switchover process a dynamic reference voltage substantially corresponding to the internal reference level 447 plus the voltage generated across resistor R$_{REF}$ 464 by constant current 446 (I$_1$*R$_{REF}$+V$_1$ in the device in FIG. 4A). In other words, shortly before a switchover process the dynamic reference voltage 448 is equal to the steady-state voltage level. The topmost curve in FIG. 5A shows an exemplary profile of a control signal 530 (U$_{GE}$) of the power semiconductor switch. The voltage level of the control signal 530 rises from a level in the switched-off state V$_{OFF}$ to a level in the switched-on state V$_{ON}$. In principle, these levels can be chosen arbitrarily. In one example, the levels V$_{OFF}$ and V$_{ON}$ correspond to the gate-emitter voltage of the power semiconductor switch, which controls the power semiconductor switch, in the switched-off and switched-on state, respectively. For example, a level in the switched-off state V$_{OFF}$ for IGBTs can lie between −20V and −5V (preferably between −15V and −7V) and a level in the switched-on state V$_{ON}$ for IGBTs can lie between 10V and 20V (preferably between 13V and 15V). For power MOSFETs, the levels V$_{OFF}$ and V$_{ON}$ can correspondingly correspond to the voltage of the gate-source voltage of the power MOSFET in the switched-off and switched-on state, respectively. For example, a level in the switched-off state V$_{OFF}$ for power MOSFETs can lie between −5V and 0V and a level in the switched-on state V$_{ON}$ for MOSFETs can lie between 10V and 25V. For SiC-based components, a level in the switched-off state V$_{OFF}$ can likewise lie between −5V and 0V and a level in the switched-on state V$_{ON}$ can lie between 10V and 20V.

As shown in FIG. 5A, the voltage level at the node B and the node A of the device for producing a dynamic reference signal 442 rises abruptly at the point in time of the switchover from a switched-off state into a switched-on state of the power semiconductor switch. This rise corresponds to the voltage swing of the control signal 530 (control signal 430 in FIG. 4A) upon the switchover from the switched-off state into the switched-on state. That can be comprehended with reference to FIG. 4A: since the voltage swing of the control signal 430 increases the voltage level at an output of the capacitance 456, the voltage level at the node B also increases by this absolute value (the diode 454 is nonconducting since the level at node B lies above the level of the second reference voltage). The amplitude of the voltage jump thus corresponds to the difference between the level in the switched-on state V$_{ON}$ and the level in the switched-on state V$_{OFF}$ of the control signal 530 (430 in FIG. 4A). Consequently, at the node B at the point in time after the switchover process this results in a voltage level V$_{Bpeak}$ of $$V_{Bpeak}V_{ON}+I_1R_{REF}+V_1-V_{OFF'}$$ (Equation 1)

This has the consequence that an additional current is driven through the resistors 460 (R$_T$), 466 (R$_1$) and 464 (R$_{REF}$). This current increases the voltage level at the node A by a specific absolute value (namely the current intensity of the additional current multiplied by the value of the resistor 464). Consequently, directly after the switch-on of the power semiconductor switch at the node A this results in a voltage of $$V_{Apeak} = \frac{(I_1 R_{REF} + V_1)(R_1 + R_T) + V_{Bpeak} R_{REF}}{R_{REF} + R_1 + R_T}$$ (Equation 2)

Since the output for tapping off the dynamic reference signal 448 is connected directly to the node A, the voltage level shown in FIG. 5A corresponds to the dynamic reference signal 448.

In addition, the additional current discharges the capacitance 456 of the passive charging circuit 450. That has the consequence that a voltage across the capacitance 454 decreases and, consequently, the voltage level at the node B also falls. It follows from that in turn that the additional current decreases and the voltage at the node A also falls (and thus so does the level of the dynamic reference signal 448). After a predetermined time, the capacitance has discharged to an extent such that no more additional current is driven through the resistor 464. Consequently, the voltage at the node A is again at its steady-state level (of I$_1$*R$_{REF}$+V$_1$). The temporary increase in the dynamic reference signal that is produced by the passive charging circuit has decayed.

The time constant of the discharge process of the capacitance 456 is determined by the values of the resistors 460 (R$_T$), 466 (R$_1$) and 464 (R$_{REF}$) and the value of the capacitance 456 (C$_T$). It and the amplitude of the voltage swing in the dynamic reference signal 448 can be chosen such that erroneous detections of an a short-circuit and/or overcurrent state after a switchover process from a switched-off state into a switched-on state of the power semiconductor switch are prevented or at least reduced and a protection function is nevertheless achieved by means of a reliable switch-off of the power semiconductor switch. That can in turn be illustrated with reference to FIG. 6. The temporary increase in the dynamic reference signal 648 ensures that the signal representative of the collector-emitter voltage lies below the dynamic reference signal in the normal case (left-hand side in FIG. 6). The short-circuit and/or overcurrent state detection circuit 240 in FIG. 2 would thus not detect a short-circuit and/or overcurrent state.

FIG. 5A additionally shows the behavior of the device for producing a dynamic reference signal 442 after a switchover process from a switched-on state into a switched-off state of the power semiconductor switch. Here the opposite process occurs relative to the case of the switchover process from the switched-off state into a switched-on state as was described further above. Once again a, in this case negative, voltage swing of the control signal 530 is present at the first input of the capacitance 454 and reduces the voltage at the node B. This in turn results in an additional current that reduces the voltage at the node A. In contrast to the switch-on process, however, now the first clamping circuit 454 is active and limits the voltage drop at the node B to the second internal reference level $V_L$. As already mentioned, the first clamping circuit 454 is optional; the device for producing a dynamic reference signal 442 can also be used without it. The dynamic reference signal 448 would then be reduced by the full voltage swing of the control signal 430. That may be disadvantageous, however, since under certain circumstances the voltage at the node A (the dynamic reference signal 448) and the voltage at the node B do not have enough time to return to the steady-state signal level.

The voltage swing at the node A, which is downwardly limited by the first clamping circuit, thus results as:

$$V_{Aclamp} = \frac{(I_1 R_{REF} + V_1)(R_1 + R_T) V_L R_{REF}}{R_{REF} + R_1 + R_T} \qquad \text{(Equation 3)}$$

Analogously to the situation described above, the additional current then has the effect that the capacitance 456 charges. At the end of this charging process, the voltage 458 across the capacitance 456 again corresponds to the voltage before the beginning of the switchover process, the additional current stops flowing and the dynamic reference voltage 548 again has its steady-state signal level ($I_1 * R_{REF} + V_1$).

Figure 4B:
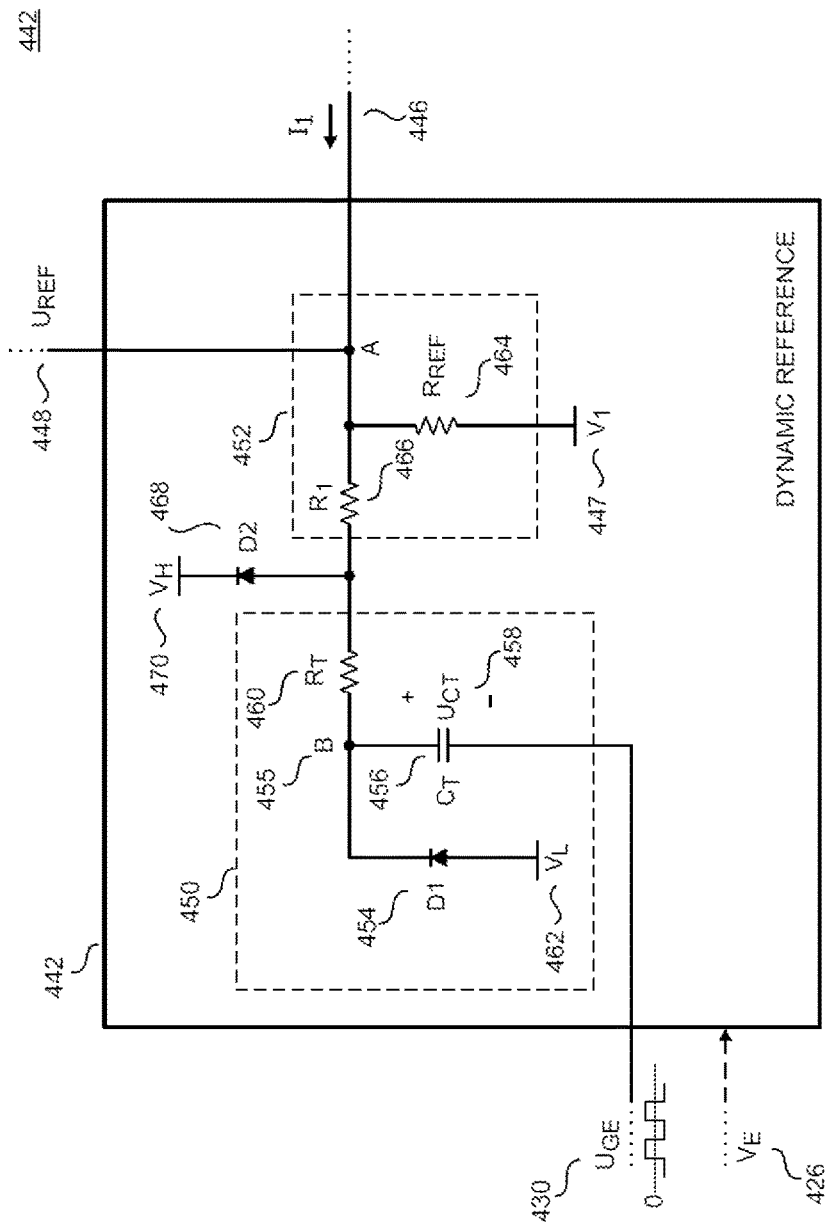
FIG. 4B shows a further example of a device for producing a dynamic reference signal.

FIG. 4B shows a second example of a device for producing a dynamic reference signal. The construction corresponds to that of the device shown in FIG. 4A in which a second clamping circuit 468, 470 is additionally provided. Said second clamping circuit is configured to limit the dynamic reference voltage 448 to a predetermined maximum value. In FIG. 4B the maximum value of the dynamic reference voltage 448 is defined by a third internal reference level $V_H$. Since the second clamping circuit 468, 470 is coupled between the resistors 460 and 466, the maximum value of the voltage $V_{apeak}$ at the node A is clamped to $$V_{Apeak} = \frac{(I_1 R_{REF} + V_1) R_1 + V_H R_{REF}}{R_{REF} + R_1} \qquad \text{(Equation 4)}$$

In order that the illustration is not made more complicated unnecessarily, for the equations discussed here a voltage drop across the diodes of zero was assumed if the diodes are forward-biased. The second clamping circuit 468, 470 can contain a second diode 468. The third internal reference level $V_H$ is chosen to prevent damage to components to which the device 442 for producing a dynamic reference signal is connected. By way of example, as shown in FIG. 2, the constant current $I_1$ can be supplied by the driver circuit 236. Since the dynamic reference signal 448 is present at the reference output of the driver circuit 236, the latter can incur damage as a result of the increased voltage level of the dynamic reference signal 448. For example, the maximum permissible voltage at the reference output of the driver circuit 236 may correspond to $V_{ON}$. In other environments, the maximum permissible voltage may also be higher, for which reason a limitation by means of the second clamping circuit 468 is not absolutely necessary.

Figure 5B:
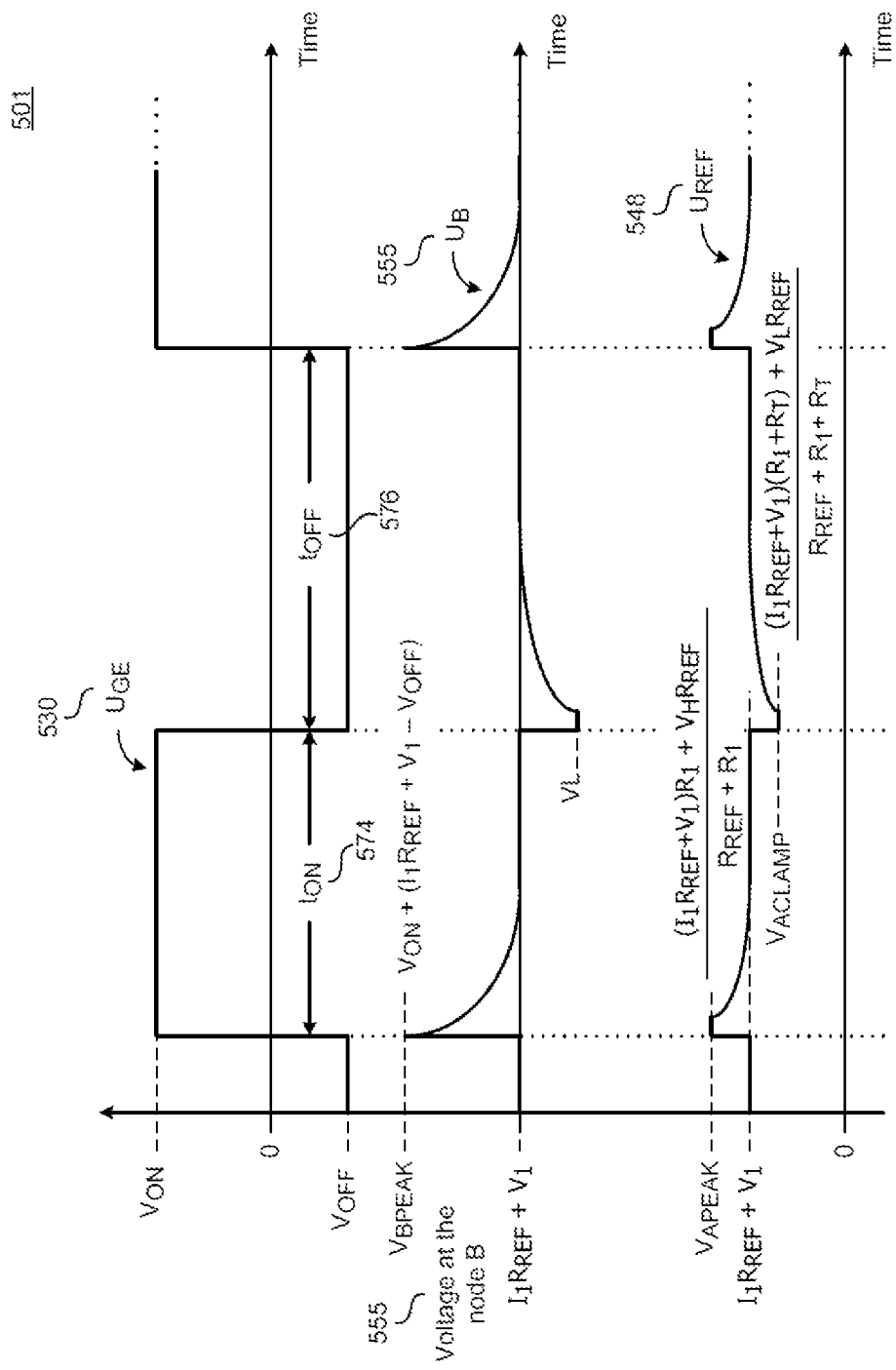
FIG. 5B shows various signals in the device for producing a dynamic reference signal from FIG. 4B.

The profile of the temporarily increased dynamic reference signal 448 in the device in accordance with FIG. 4B is depicted schematically in FIG. 5B. It can be seen here that the profile of the voltage level at the node B in the devices in accordance with FIG. 4A and FIG. 4B is identical. The profile of the temporary reduction of the dynamic reference signal 548 below its steady-state level also corresponds to that depicted schematically in FIG. 5A. A difference can be seen in the switchover process from a switched-off state into a switched-on state of the power semiconductor switch. Here the dynamic reference signal is firstly clamped to the value given in equation 4 until the diode 468 of the second clamping circuit stops conducting. Afterward, the dynamic reference voltage 548 falls again to its steady-state signal level.

Figure 7:
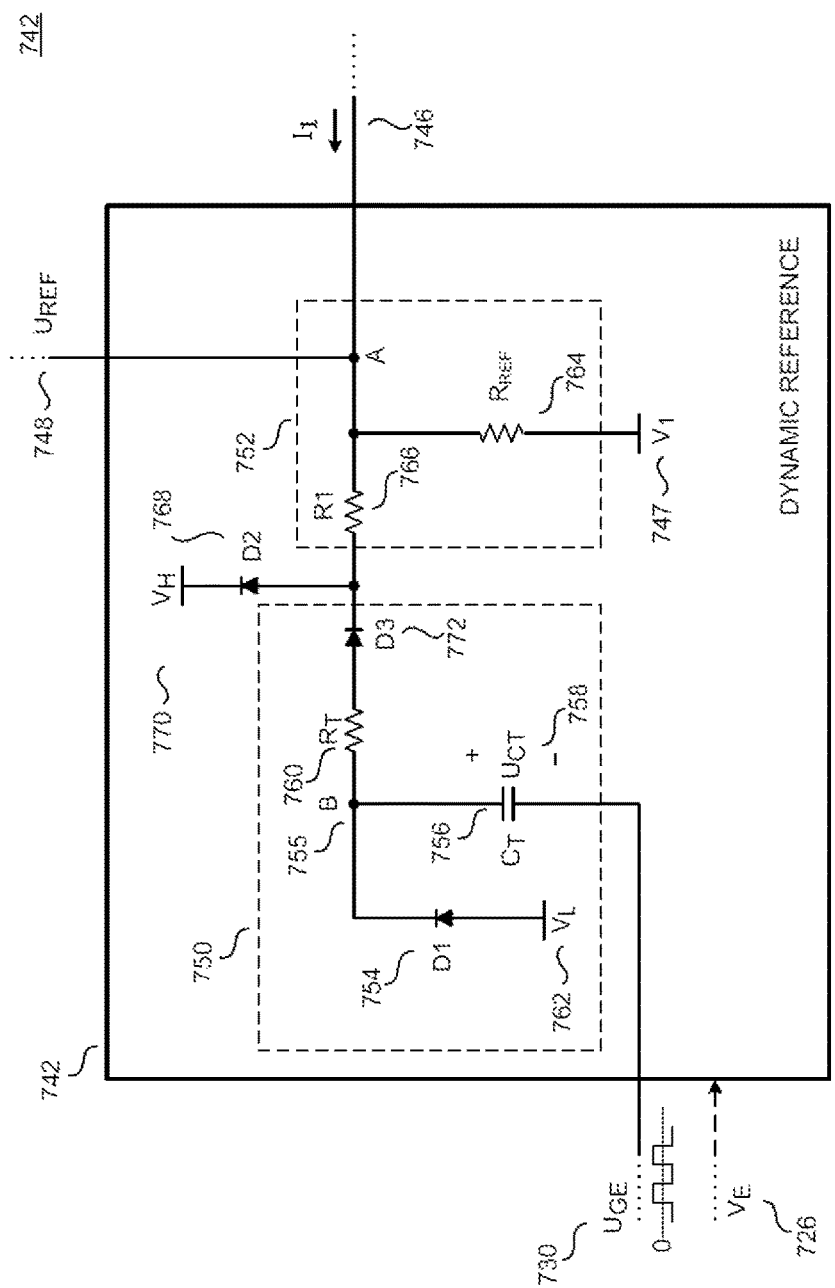
FIG. 7 shows a further example of a device for producing a dynamic reference signal.
Figure 8:
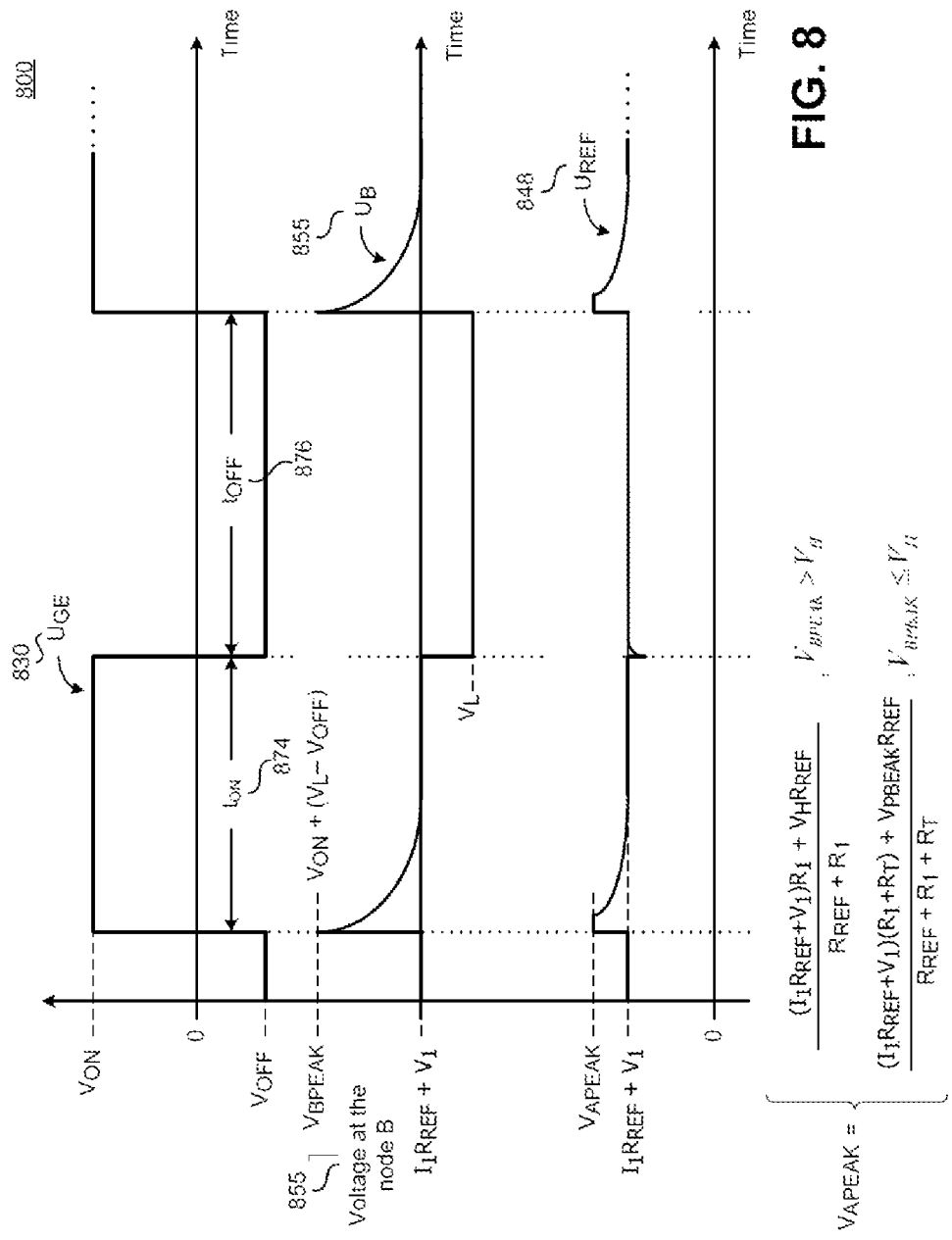
FIG. 8 shows various signals in the device for producing a dynamic reference signal from FIG. 7.

In FIG. 7 there is a third example of a device for producing a dynamic reference signal 742. The device corresponds to the device 442 shown in FIG. 4B, with the exception that a third diode 772 ($D_3$) is arranged between the second clamping circuit 768, 570 and the resistor 760 ($R_T$). The third diode 772 ($D_3$) influences the behavior of the device for producing a dynamic reference signal 742 after a switchover process of the power semiconductor switch from a switched-on state into a switched-off state. As can be seen in FIG. 8, the profiles of the voltage levels at the nodes A (corresponding to the dynamic reference signal 848) and the voltage level at the node B 855 after the switch-on process correspond to those shown in FIG. 5B. After a switchover process from a switched-on state to a switched-off state of the power semiconductor switch, the behavior of the devices for producing a dynamic reference signal in accordance with FIG. 4B and FIG. 8 differs, however.

If the negative voltage swing of the control signal 830 reduces the voltage level at node B (limited in turn by the first clamping circuit 754 to the voltage level $V_L$), the diode 772 ($D_3$) is turned off. The reference signal generator 752 is thus decoupled from the passive charging circuit 752. That in turn has the consequence that a fall in the voltage level at the node A below the steady-state signal level (and thus also in the dynamic reference signal 748) can be prevented or considerably reduced. The voltage level at the node A returns very rapidly to its static level ($V_1 + I_1 * R_{REF}$) since this process is no longer coupled to the discharge behavior of the capacitance 756 of the RC element of the passive charging circuit 750. The voltage $U_{CT}$ across the capacitance 756 ($C_T$) after the change from the OFF state into the ON state is statically $U_{CT} = (I_1 * R_{REF} + V_1) - V_{ON}$. The capacitance is discharged to this value via $R_T$, $R_1$ and $R_{REF}$, which leads to the dynamic increase in the dynamic reference voltage $U_{REF}$. Upon the change from the on into the off state, the capacitance 756 ($C_T$) is recharged to the value $U_{CT} = V_L - V_{OFF}$ via the first clamping circuit 754 without significant delay (no resistor is involved in the charging; the diode D1 is disregarded here). Since the second internal reference level 762 ($V_L$) is lower than $I_1 * R_{REF} + V_1$, the diode 772 (D3) is turned off. Consequently, the the capacitance 756 ($C_T$) is not additionally recharged via this path. This behavior is illustrated in curve 848 in FIG. 8, which shows the temporal profile of the dynamic reference signal in the device in accordance with FIG. 8.

A suppression or reduction of the negative excursion (below the steady-state voltage level) is advantageous since the negative excursion of the dynamic reference signal 748 for example in the case of short off periods 876 ($t_{OFF}$) can have the consequence that the dynamic reference signal 848 has not yet returned to its static value again when a subsequent switch-on process takes place. That can have the consequence that the dynamic reference signal $U_{REF}$ is "compressed" upon switch-on (see FIG. 6, bottom left) in the dynamic (i.e. the peak value of the dynamic reference signal $U_{REF}$ is lower than in the case of longer off periods 876). That in turn, under certain circumstances, can have the effect that the signal $U_{C'E}$ representative of the collector-emitter voltage can cross the profile of the dynamic reference signal $U_{REF}$ even upon normal switch-on. The overcurrent state detection circuit 240 then reports an overcurrent state or short-circuit state to the driver circuit 236, even though nothing of the sort has occurred.

The above description of the illustrated examples of the present invention is not meant to be exhaustive or restricted to the examples. While specific embodiments and examples of the invention are described herein for illustration purposes, various modifications are possible without departing from the present invention. The specific examples for voltage, current, frequency, power, range values, times, etc. are merely illustrative, such that the present invention can also be implemented with other values for these variables.

These modifications can be made to examples of the invention in light of the detailed description above. The terms used in the following claims should not be interpreted such that the invention is restricted to the specific embodiments disclosed in the description and the claims. The present description and the figures should be regarded as illustrative and not as restrictive.

The invention claimed is:

1. A device for producing a dynamic reference signal for a control circuit for a power semiconductor switch, wherein the device comprises:
    a reference signal generator for providing a dynamic reference signal having a steady-state signal level after a predetermined time has elapsed after a switchover process of the power semiconductor switch;
    a passive charging circuit, which is configured to increase a signal level of the dynamic reference signal in reaction to a switchover of a control signal of the power semiconductor switch from an OFF state into an ON state for at least one part of the predetermined time above the steady-state signal level, in order to produce the dynamic reference signal; and
    an output for tapping off the dynamic reference signal.

2. The device as claimed in claim 1, wherein the dynamic reference signal is a dynamic reference voltage.

3. The device as claimed in claim 1, wherein the passive charging circuit comprises an RC element.

4. The device as claimed in claim 1, wherein the passive charging circuit is configured to increase the signal level of the dynamic reference signal in reaction to the switchover of the control signal in the manner of an abrupt jump.

5. The device as claimed in claim 3, wherein the passive charging circuit is further configured such that the capacitance of the RC element charges following a switchover of a control signal of the power semiconductor switch from an ON state into an OFF state.

6. The device as claimed in claim 3, wherein the passive charging circuit is configured such that the capacitance of the RC element discharges following the switchover of the control signal and thus produces the temporarily increased level of the dynamic reference signal and returns it to the steady-state level again as a result of the discharge.

7. The device as claimed in claim 1, wherein the reference signal generator contains a circuit for producing the steady-state signal level.

8. The device as claimed in claim 1, further comprising:
    a first clamping circuit, which is configured to limit the dynamic reference signal to a predetermined minimum level.

9. The device as claimed in claim 1, further comprising:
    a second clamping circuit, which is configured to restrict the dynamic reference signal to a predetermined maximum level.

10. The device as claimed in claim 1, further comprising:
    a passive switch, which is coupled between the reference signal generator and the passive charging circuit, wherein the passive switch is configured to isolate the reference signal generator and the passive charging circuit in reaction to a switchover of the control signal of the power semiconductor switch from an ON state into an OFF state.

11. The device as claimed in claim 1, wherein the dynamic reference signal is a current signal.

12. The device as claimed in claim 1, wherein the circuit for producing a dynamic reference signal an input for coupling to an external static reference level, and wherein the circuit for producing a dynamic reference signal is configured to use the static reference level directly or in converted form as the steady-state signal level.

13. The device as claimed in claim 1, wherein an internal reference level of the device forms the steady-state signal level.

14. The device as claimed in claim 3, wherein the capacitance of the RC element discharges with a time constant selected in order to prevent the short-circuit and/or overcurrent state detection circuit from detecting a short-circuit and/or overcurrent state in normal operation.

15. The device as claimed in claim 3, wherein the capacitance of the RC element discharges with a time constant selected in order to ensure that the short-circuit and/or overcurrent state detection circuit detects a short-circuit and/or overcurrent state in the short-circuit and/or overcurrent case.

* * * * *